US006714064B2

(12) United States Patent
Limbrunner

(10) Patent No.: US 6,714,064 B2
(45) Date of Patent: Mar. 30, 2004

(54) MULTIPLEXER CIRCUIT AND METHOD FOR DETECTION OF THE SWITCHING STATE OF SWITCHING ELEMENTS

(75) Inventor: Hubert Limbrunner, Kirchroth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/274,310

(22) Filed: Oct. 18, 2002

(65) Prior Publication Data

US 2003/0090312 A1 May 15, 2003

(30) Foreign Application Priority Data

Oct. 18, 2001 (DE) ........................................ 101 51 416

(51) Int. Cl.[7] ................................................ H03K 17/62
(52) U.S. Cl. .......................................... 327/407; 327/91
(58) Field of Search .............................. 327/91, 94–96, 327/407–411

(56) References Cited

U.S. PATENT DOCUMENTS 3,550,016 A 12/1970 Gugliotti .................... 327/407

FOREIGN PATENT DOCUMENTS

| | | | |
|---|---|---|---|
| DE | DD-PS 79 325 | | 1/1971 |
| DE | 40 15 271 | A1 | 11/1991 |
| DE | 195 36 196 | C1 | 5/1998 |
| JP | 60-214 629 | A | 10/1985 |

*Primary Examiner*—Kenneth B. Wells
(74) *Attorney, Agent, or Firm*—Baker Botts L.L.P.

(57) ABSTRACT

Multiplexer circuit having a number of signal inputs (4.1–4.6) for receiving in each case one input signal, at least one signal output (IN1–IN3) for outputting an output signal which corresponds to one of the input signals, at least one control input (STROBE1, STROBE2) for receiving a control signal which selects at least one of the input signals for passing on to the signal output, a sampling circuit (T1–T4, R16-R23) which is connected to the signal inputs (4.1–4.6), for sampling the signal inputs (4.1–4.6) with a sampling signal with the sampling circuit being connected to the control input (STROBE1, STROBE2), and applying the sampling signal to a single signal input or to a group of signal inputs as a function of the control signal.

20 Claims, 1 Drawing Sheet

MULTIPLEXER CIRCUIT AND METHOD FOR DETECTION OF THE SWITCHING STATE OF SWITCHING ELEMENTS

CROSS REFERENCE TO RELATED APPLICATIONS

This application claims foreign priority benefits under 35 U.S. C. §119 of German application DE 10151416.6 filed Oct. 18, 2001.

BACKGROUND OF THE INVENTION

The invention relates to a multiplexer circuit, in particular for detection of the switching state of a number of switching elements by means of a microprocessor in a motor vehicle.

As is known, modem motor vehicles have microprocessors which monitor a large number of electrical signals, and the number of signals to be monitored is increasing continuously as the use of electrical actuators and sensors increases. For example, the microprocessor for the vehicle electronics has to check the state of the door contact switches, which are normally in the form of low-side switches and to which a voltage is briefly applied by means of a sampling signal (strobe) so that the current flowing through the door contact switch and/or the voltage drop across the door contact switch when the sampling signal is applied indicates the switching state of the door contact switch. Application of the sampling signal for only a brief time offers the advantage that only a relatively small amount of electrical energy is consumed by the monitoring of the door contact switch. A circuit such as this is known, for example, from DE 40 15 271 A1.

The disadvantage of using a microprocessor for monitoring a large number of signals is the fact that the microprocessor in principle requires one signal input for each signal to be monitored, so that ever more complex microprocessors are required.

In order to solve this problem, it is known for a multiplexer circuit to be connected upstream of the signal inputs of the microprocessor, which multiplexer circuit can pass on a large number of input signals to a smaller number of signal inputs of the microprocessor as a function of a control signal-which is produced by the microprocessor, so that the microprocessor requires fewer signal inputs. For example, one multiplexer circuit such as this can pass on eight input signals to one signal input of the microprocessor as a function of a three-bit control signal, so that the microprocessor requires a total of only four inputs and outputs for monitoring eight signals. One such circuit is known, for example, from DE 195 36 196 C1.

However, one disadvantage of the circuit arrangement with a multiplexer as described above is the fact that, in addition to the multiplexer, a separate sampling circuit is required in order to produce the brief sampling signal (strobe), and this results in relatively high circuitry complexity.

SUMMARY OF THE INVENTION

The invention is therefore based on the object of reducing the circuitry complexity in the multiplexer circuit as described above.

Against the background of the known multiplexer circuit as described above the invention is achieved by a multiplexer circuit for detection of the switching state of a number of switching elements by means of a microprocessor in a motor vehicle, having a number of signal inputs for receiving in each case one input signal, at least one signal output for outputting an output signal which corresponds to one of the input signals, at least one control input for receiving a control signal which selects at least one of the input signals for passing on to the at least one signal output, a sampling circuit which is connected to the signal inputs, for sampling the signal inputs with a sampling signal in order to check the electrical state of the switching elements which are connected to the signal inputs with the sampling circuit being connected to the control input, wherein the sampling circuit applies the sampling signal to a group of signal inputs as a function of the control signal, and a number of signal inputs are jointly connected to one signal output, with the signal inputs being connected to the signal output independently of the control signal.

Another embodiment is a multiplexer circuit in a microprocessor arrangement, having a number of signal inputs for receiving in each case one input signal, a number of switching elements coupled through a connecting network with the number of signal inputs, wherein the number of switching elements is higher than the number of signal inputs and wherein the connecting network couples at least two switching elements with one signal input; at least one control output; and a sampling circuit coupled with the control output for generating a sampling signal which depending on the control signal feeds a bias signal to a predefined group of the switching elements through the connecting network in such a way that only one switching element per signal input receives the sampling signal directly.

A method according to the present invention for operating a microprocessor arrangement for determining the status of a plurality of switching elements, wherein the microprocessor comprises a plurality of signal inputs being less than the plurality of switching elements, comprises the steps of:

- coupling the plurality of switching elements through a connecting network with the plurality of signal inputs, wherein at least two switching elements are coupled with one signal input;
- generating a sampling signal for a predefined group of the switching elements in such a way that the sampling signal is fed through the connecting network in to only feed one switching element per signal input directly with the sampling signal.

The invention comprises the general technical teaching of integrating the sampling circuit, which is present in any case, in the multiplexer circuit in order to use selective sampling of single groups of signal inputs to select the input signals which are to be passed on.

The multiplexer circuit according to the invention therefore has a sampling circuit which is connected to the signal inputs and samples them with a sampling signal in order to check the electrical state of the components (for example door contact switches) which are connected to the signal inputs. According to the invention, the sampling circuit is connected to a control input which, for example, is driven with a control signal from a microprocessor, with the sampling circuit applying a sampling signal to a group of signal inputs as a function of the control signal, in order to select the respective input signals. The signals are thus in this case selected by selectively applying the sampling signal to the signal inputs, so that there is no need for a separate conventional multiplexer.

According to the invention, the signal inputs are therefore permanently electrically connected to the signal output independently of the control signal, with a high-value resistor and/or a diode preferably being arranged in each of the signal paths from the signal inputs to the signal output or outputs, in order to avoid reactions from the signal inputs which are not being sampled on the signal inputs which are being sampled.

In the multiplexer circuit according to the invention, a number of signal inputs are combined to form a group and are jointly connected to one signal output which, for example, is sampled by one signal input of a microprocessor. If there are six signal inputs to be monitored, these may each be joined together in pairs, for example, at three signal outputs.

When signal inputs are combined in groups in this way, there must be a corresponding number of control inputs in order to select the desired signal input from each group of signal inputs. Two control signals are therefore required if six signal inputs are combined to form three groups, which each have two signal inputs.

In general, it can be stated that the number of signal inputs which can be sampled is preferably equal to the product of the number of control inputs and the number of signal outputs.

The number of control inputs and the number of signal outputs for a predetermined number of control inputs to be monitored are preferably chosen such that the sum of the number of signal outputs and the number of control inputs is a minimum in order that, for example, a downstream microprocessor requires as few electrical connections as possible for the input/output. The number of signal outputs and the number of control inputs are preferably optimized for the purpose described above by the number of signal outputs being equal to an integer divisor of the number of signal inputs, with the optimization criterion to be observed being that the number of signal outputs should be as close as possible to the square root of the number of signal inputs. The number of control inputs is then given by the quotient of the number of signal inputs and the optimum number of signal outputs. If there are twelve signal inputs to be monitored, for example, the optimum is three signal outputs and four control inputs, which leads to the downstream microprocessor requiring only seven inputs and outputs.

If the signal inputs are in each case combined to form groups of two signal inputs, it is advantageous for the sampling circuit to have a push-pull drive circuit, which applies the sampling signal in antiphase to each of the two signal inputs in one group. A push-pull drive circuit such as this may be in the form of a push-pull circuit.

It should also be mentioned that the signal inputs can be connected to any desired electrical components whose resistance changes as a function of their state. The multiplexer circuit according to the invention is preferably used, however, for monitoring low-side switches which are used, for example, as door contact switches in a motor vehicle. When such low-side switches are used, a short pulse and a high level is preferably used as the sampling signal.

However, instead of low-side switches, the multiplexer circuit according to the invention may also be used for monitoring high-side switches, with the sampling signal in the case such as this preferably being formed from short pulses at a low level.

BRIEF DESCRIPTION OF THE DRAWINGS

Other advantageous developments of the invention are characterized in the dependent claims or are explained in more detail in the following text together with the description of the preferred exemplary embodiment of the invention as shown in FIG. 1.

DETAILED DESCRIPTION OF THE PREFERRED EMBODIMENT

Figure 1:
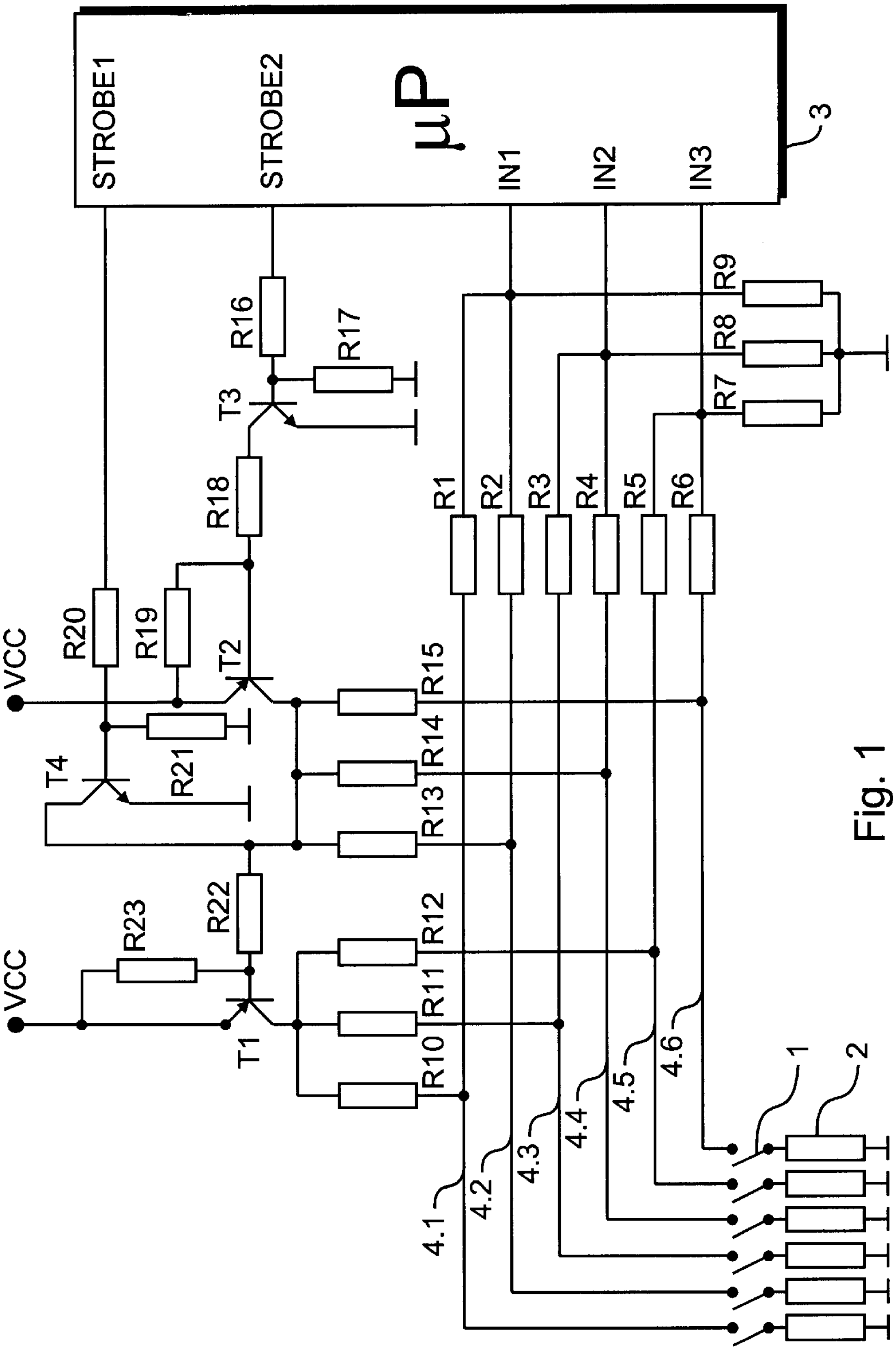

The multiplexer circuit as illustrated in FIG. 1 thus makes it possible to monitor six switching elements, each of which comprises a series circuit formed from an ideal switch 1 and a non-reactive resistor 2, by means of one microprocessor 3 having three signal inputs IN1-IN3 and two control outputs STROBE1, STROBE2.

The six switching elements are each connected separately to one of six signal inputs 4.1, 4.6 of the multiplexer circuit, with the signal inputs 4.1, 4.6 each being joined together in pairs to form groups of two signal inputs. The two signal inputs 4.1 and 4.2 are thus connected to the signal input IN1 of the microprocessor 3 via in each case one resistor R1=100 kΩ and R2=100 kΩ. The signal inputs 4.3 and 4.4 of the multiplexer circuit are connected in the same way to the second signal input IN2 of the microprocessor 3 by means of in each case one resistor R3=100 kΩ and R4=100 kΩ.

Finally, the signal inputs 4.5 and 4.6 are connected to the third signal input IN3 of the microprocessor 3 by in each case one resistor R5=100 kΩ and R6=100 kΩ.

Furthermore, the three signal outputs of the multiplexer circuit are connected to ground via a respective resistor R7, R8 or R9, with a value of 100 kΩ.

The six switching elements are checked by means of a sampling circuit which applies a short pulse at a high level to the signal input of the respective switching element. The sampling circuit is driven by the two control signals STROBE1 and STROBE2, which are produced by the microprocessor 3.

The design of the sampling circuit of the multiplexer circuit according to the invention will now be explained in the following text.

The signal inputs 4.1, 4.3 and 4.5 are connected via a respective resistor R10, R11 or R12 to a value of 820 Ω, and via a transistor T1 to a supply voltage VCC. Thus, when the transistor T1 is switched on, a sampling signal at a high level is applied to the signal inputs 4.1, 4.3 and 4.5.

In the same way, the other signal inputs 4.2, 4.4 and 4.6 are connected via resistors R13, R14 and R15 and a further transistor T2 to the supply voltage VCC, so that the signal inputs 4.2, 4.4 and 4.6 have a sampling signal at a high level applied to them when the transistor T2 is switched on.

The transistor T2 is driven via an intermediate control circuit by means of the control signal STROBE2 from the microprocessor 3. The control circuit which is arranged between the microprocessor 3 and the transistor T2 first of all has a voltage divider, which is formed from two resistors R16 and R17. The voltage divider in turn drives a transistor T3, which drives the transistor T2 via two resistors R18, R19.

If the control signal STROBE2 assumes a high level, then in consequence the transistor T2 is switched on, which leads to a sampling signal at a high level being applied to the signal inputs 4.2, 4.4 and 4.6.

The transistor T1 for the signal inputs 4.1, 4.3 and 4.5 is likewise driven via a control circuit by the microprocessor 3. This control circuit also has a voltage divider, which is formed from two resistors R20 and R21, with the voltage divider driving a further transistor T4. The transistor T4 in turn drives the transistor T1 via two resistors R22 and R23. Overall, a high level of the control signal STROBE 1 leads to the transistor T1 being switched on, so that a sampling signal at a high level is applied to the signal inputs 4.1, 4.3 and 4.5.

The microprocessor in this case produces the control signals STROBE1 and STROBE2 in antiphase, in order to select only one signal input from each group of signal inputs. When the control signal STROBE1 is at a high level and the control signal STROBE2 is at a low level, the microprocessor 3 detects at the signal input IN1, for example, the signal which is applied to the signal input 4.1, while the signal which is applied to the signal input 4.3 is in this case detected at the signal input IN2 of the microprocessor 3. Finally, with a combination of the control signals STROBE1 and STROBE2 such as this, the microprocessor 3 detects at the signal input IN3 the signal which is applied to the signal input 4.5.

When the control signal STROBE1 is at a low level and the control signal STROBE2 is at a high level, on the other hand, the other signal inputs 4.2, 4.4, 4.6 of the three groups are detected at the respective signal inputs IN1-IN3 of the microprocessor 3.

The invention is not restricted to the exemplary embodiment described above. In fact, a large number of variants and modifications are possible, which likewise fall within the area of protection.

What is claimed is:

1. A multiplexer circuit for detection of the switching state of a number of switching elements by means of a microprocessor in a motor vehicle, comprising a number of signal inputs for receiving in each case one input signal, at least one signal output for outputting an output signal which corresponds to one of the input signals, at least one control input for receiving a control signal which selects at least one of the input signals for passing on to the at least one signal output, a sampling circuit which is connected to the signal inputs-, for sampling the signal inputs with a sampling signal in order to check the electrical state of the switching elements which are connected to the signal inputs with the sampling circuit being connected to the control input, wherein the sampling circuit applies the sampling signal to a group of signal inputs as a function of the control signal, and a number of signal inputs are jointly connected to said at least one signal output wherein only one of the jointly connected signal inputs is assigned to said group.

2. The multiplexer circuit as claimed in claim 1, wherein a resistor is arranged in each of the signal paths from the signal inputs to a respective signal outputs, in order to avoid electrical reactions from the signal inputs to which the sampling signal is not applied on the signal inputs to which the sampling signal is applied.

3. The multiplexer circuit as claimed in claim 1, wherein the number of signal inputs is equal to the product of the number of control inputs and the number of signal outputs.

4. The multiplexer circuit as claimed in claim 3, wherein the sum of the number of signal outputs and the number of control inputs is a minimum number of inputs and outputs.

5. The multiplexer circuit as claimed in claim 1, wherein the number of signal outputs is half as great as the number of signal inputs, with the number of control inputs being equal to two.

6. The multiplexer circuit as claimed in claim 1, wherein the sampling circuit comprises:

a push-pull drive circuit, which drives two signal inputs or two groups of signal inputs in antiphase with the sampling signal.

7. The multiplexer circuit as claimed in claim 1, wherein the switching elements whose state is to be determined are low-side switches connected to the signal inputs and the sampling signal is at a high level.

8. The multiplexer circuit as claimed in claim 1, wherein the switching elements whose state is to be determined are high-side switches connected to the signal inputs and the sampling signal is at a low level.

9. The multiplexer circuit as claimed in claim 1, wherein the signal outputs and the control inputs are connected to a microprocessor.

10. The multiplexer circuit as claimed in claim 1, wherein the signal outputs are connected to at least one pull-down resistor.

11. A multiplexer circuit in a microprocessor arrangement, comprising:

a number of signal outputs, a number of switching elements each connected to a respective signal input wherein said signal inputs are coupled through a connecting network with the number of signal outputs, wherein the number of switching elements is higher than the number of signal outputs and wherein the connecting network couples at least two switching elements with one signal output;

a sampling circuit having at least one control input for generating a sampling signal which depending on a control signal feeds a bias signal to the signal inputs of a predefined group of the switching elements wherein only one switching element of the at least two switching elements receives the bias signal.

12. The multiplexer circuit as claimed in claim 11, wherein each switching element is coupled with a respective signal output through a resistor.

13. The multiplexer circuit as claimed in claim 11, wherein the number of signal inputs is equal to the product of the number of control inputs and the number of switching elements.

14. The multiplexer circuit as claimed in claim 13, wherein the sum of the number of switching elements and the number of control inputs is a minimum number of inputs and outputs.

15. The multiplexer circuit as claimed in claim 11, wherein the number of switching elements is half as great as the number of signal outputs, with the number of control inputs being equal to two.

16. The multiplexer circuit as claimed in claim 11, wherein the sampling circuit comprises a push-pull drive circuit, which drives two signal inputs or two groups of signal inputs in antiphase with the sampling signal.

17. The multiplexer circuit as claimed in claim 11, wherein the switching elements are low-side switches which are connected to the signal inputs and the sampling signal is at a high level.

18. The multiplexer circuit as claimed in claim 11, wherein the switching elements are high-side switches which are connected to the signal inputs and the sampling signal is at a low level.

19. The multiplexer circuit as claimed in claim 11, wherein the connecting network comprises coupling elements selected from the group of resistors and diodes.

20. Method for operating a microprocessor arrangement for determining the status of a plurality of switching elements, wherein the microprocessor comprises a plurality of signal inputs being less than the plurality of switching elements, the method comprising the steps of:

coupling the plurality of switching elements through a connecting network with the plurality of microprocessor inputs, wherein at least two switching elements are coupled with one microprocessor input;

generating a sampling signal which is fed to a predefined group of the switching elements wherein said group includes only one of said at least two switching elements.

* * * * *